(12) United States Patent
Shimodaira

(10) Patent No.: US 10,643,934 B2
(45) Date of Patent: May 5, 2020

(54) WIRING SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Tomoyuki Shimodaira, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 0 days.

(21) Appl. No.: 16/243,199

(22) Filed: Jan. 9, 2019

(65) Prior Publication Data

US 2019/0221508 A1 Jul. 18, 2019

(30) Foreign Application Priority Data

Jan. 17, 2018 (JP) ................... 2018-005651

(51) Int. Cl.
| | |
|---|---|
| *H01L 23/48* | (2006.01) |
| *H01L 23/498* | (2006.01) |
| *H01L 23/31* | (2006.01) |
| *H01L 23/538* | (2006.01) |
| *H01L 23/15* | (2006.01) |
| *H01L 23/00* | (2006.01) |
| *H01L 21/56* | (2006.01) |

(52) U.S. Cl.
CPC ........ *H01L 23/49811* (2013.01); *H01L 23/15* (2013.01); *H01L 23/3142* (2013.01); *H01L 23/3157* (2013.01); *H01L 23/49816* (2013.01); *H01L 23/49822* (2013.01); *H01L 23/49827* (2013.01); *H01L 23/49838* (2013.01); *H01L 23/49866* (2013.01); *H01L 23/5383* (2013.01); *H01L 23/5386* (2013.01); *H01L 24/16* (2013.01); *H01L 21/563* (2013.01)

(58) Field of Classification Search
CPC ........... H01L 23/49811; H01L 23/3142; H01L 23/49822; H01L 23/49866; H01L 23/3157; H01L 21/563; H01L 21/49827; H01L 24/16; H01L 23/49838; H01L 23/49816; H01L 23/15; H01L 23/5383; H01L 23/5386; H01L 23/562; H01L 23/528

See application file for complete search history.

(56) References Cited

U.S. PATENT DOCUMENTS

| | | | |
|---|---|---|---|
| 9,711,476 B2* | 7/2017 | Shimodaira | ............. H01L 24/16 |
| 10,028,393 B2* | 7/2018 | Shimizu | ............. H01L 25/0655 |
| 2010/0133697 A1* | 6/2010 | Nilsson | ............... B81C 1/00095 257/774 |

(Continued)

FOREIGN PATENT DOCUMENTS

JP 2007-103878 4/2007

*Primary Examiner* — Shouxiang Hu
(74) *Attorney, Agent, or Firm* — Rankin, Hill & Clark LLP

(57) ABSTRACT

A wiring substrate include a pad, an insulation layer having an opening arranged on the pad, a metal post including a seed layer and a metal plated layer, the seed layer arranged on the pad and an upper surface of the insulation layer, the metal plated layer arranged on the seed layer, and a connection metal layer formed on the metal plated layer. A side surface of the metal plated layer has a concave surface recessed inward from a lower end of the connection metal layer. A side surface of the seed layer is recessed inward from a lower end of the metal plated layer.

11 Claims, 17 Drawing Sheets

(AFTER SECOND WET ETCHING)

(56) References Cited

U.S. PATENT DOCUMENTS

| | | | |
|---|---|---|---|
| 2015/0098204 A1* | 4/2015 | Yoshikawa | H01L 23/00 361/767 |
| 2016/0020142 A1* | 1/2016 | Chen | H01L 21/76862 438/654 |

* cited by examiner (PARTIALLY REDUCED PLAN VIEW)

(AFTER FIRST WET ETCHING)

(AFTER SECOND WET ETCHING)

(PARTIALLY REDUCED PLAN VIEW)

WIRING SUBSTRATE AND ELECTRONIC COMPONENT DEVICE

CROSS-REFERENCE TO RELATED APPLICATION

This application is based on and claims priority under 35 USC 119 from Japanese Patent Application No. 2018-005651 filed on Jan. 17, 2018.

TECHNICAL FIELD

The present disclosure relates to a wiring substrate and an electronic component device.

BACKGROUND ART

In the related art, a wiring substrate for mounting thereon electronic components such as a semiconductor chip and the like has been known. In an example of the wiring substrate, a copper post is erected on a pad of the wiring substrate, the semiconductor chip is flip chip-connected to the copper post, and an underfill resin is filled between the semiconductor chip and the wiring substrate.

Patent Document 1: JP-A-2007-103878

As described later in paragraphs of preliminary matters, linear thermal expansion coefficients are different between the copper post of the wiring substrate and the underfill resin. For this reason, when the underfill resin is subjected to heating processing, a gap is likely to be generated between a side surface of the copper post and the underfill resin due to deformation resulting from thermal shrinkage of the underfill resin.

SUMMARY OF INVENTION

Exemplary embodiments of the present invention provide a wiring substrate including a metal post having a sufficient adhesive force with an underfill resin, and an electronic component device.

A wiring substrate according to an exemplary embodiment comprises:
a pad;
an insulation layer having an opening arranged on the pad;
a metal post including a seed layer and a metal plated layer, the seed layer arranged on the pad and an upper surface of the insulation layer, the metal plated layer arranged on the seed layer; and
a connection metal layer formed on the metal plated layer,
wherein a side surface of the metal plated layer has a concave surface recessed inward from a lower end of the connection metal layer, and
wherein a side surface of the seed layer is recessed inward from a lower end of the metal plated layer.

A manufacturing method of a wiring substrate, according to an exemplary embodiment, comprises:
preparing a wiring member having a pad;
forming, on the wiring member, an insulation layer having a first opening to be arranged on the pad;
forming a seed layer on an inner surface of the first opening and on an upper surface of the insulation layer;
forming, on the insulation layer, a resist layer having a second opening to be arranged on the first opening;
forming, on the seed layer in the first opening and the second opening, a metal plated layer and a connection metal layer in corresponding order by an electrolytic plating;
removing the resist layer;
etching side surfaces of the metal plated layer and the seed layer by a first wet etching, thereby forming a side surface of the metal plated layer as a concave surface recessed inward from a lower end of the connection metal layer, and
forming, on a side surface of the seed layer, an eroded part recessed inward from a lower end of the metal plated layer by a second wet etching.

According to the present disclosure, the metal post configured by the seed layer and the metal plated layer is formed on the pad of the wiring substrate, and the connection metal layer is formed on the metal post.

The side surface of the metal plated layer of the metal post is formed as the concave surface recessed inward from the lower end of the connection metal layer. Also, the side surface of the seed layer below the metal plated layer is recessed inward from the lower end of the metal plated layer.

The semiconductor chip is flip chip-connected to the connection metal layer on the metal post of the wiring substrate, and the underfill resin is filled therebetween.

At this time, since the side surface of the metal plated layer of the metal post is formed as the concave surface, it is possible to increase a contact area between the metal post and the underfill resin. As a result, it is possible to increase the adhesive force between the underfill resin and the metal post.

Also, a peripheral edge part of the connection metal layer is configured as a protrusion protruding outward from the metal post and the side surface of the seed layer of the metal post is formed with the eroded part. For this reason, the underfill resin is prevented from deviating upward from the metal post, which is caused due to deformation resulting from the thermal shrinkage during heating processing.

DESCRIPTION OF EMBODIMENTS

Hereinafter, an exemplary embodiment will be described with reference to the accompanying drawings.

Before describing the exemplary embodiment, preliminary matters, which are a basis of the present disclosure, are described. It should be noted that the preliminary matters include personal investigation contents of the inventors and include technology contents, which are not a known technology.

Figure 1:
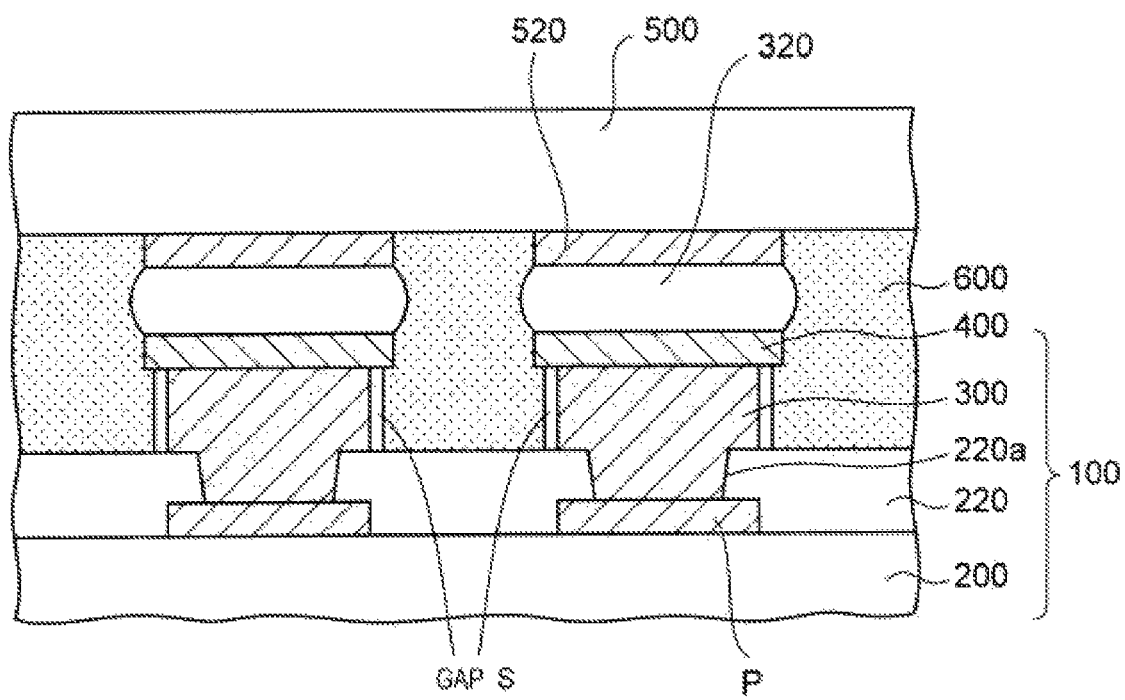
FIG. 1 is a sectional view for illustrating problems of a wiring substrate relating to preliminary matters.

FIG. 1 is a sectional view for illustrating problems of a wiring substrate relating to preliminary matters. In FIG. 1, a shape of a connection part between a copper post of a wiring substrate and a connection terminal of a semiconductor chip is partially shown.

As shown in FIG. 1, a wiring substrate 100 relating to the preliminary matters is formed with copper pads P on an insulation layer 200 of a component mounting side. The copper pads P are electrically connected to a multi-layered wiring layer (not shown) formed at a lower side.

On the insulation layer 200, a solder resist layer 220 having openings 220a arranged on the copper pads P is formed.

Also, a copper post 300 is formed around the opening 220a of the solder resist layer 220 from a top of the copper pad P. Also, a connection metal layer 400 formed on the copper post 300 is formed by a nickel (Ni) layer, a palladium (Pd) layer and a gold (Au) layer stacked in corresponding order from below.

Also, a connection terminal 520 of a semiconductor chip 500 is flip chip-connected to the connection metal layer 400 on the copper post 300 of the wiring substrate 100 by a solder 320. Also, an underfill resin 600 is filled between the semiconductor chip 500 and the wiring substrate 100.

An external connection terminal (not shown) of the wiring substrate 100 having the semiconductor chip 500 mounted thereon is connected to a mounting substrate (not shown) such as a motherboard by subjecting the solder to reflow heating.

At this time, linear thermal expansion coefficients are different between the copper post 300 of the wiring substrate 100 and the underfill resin 600. For this reason, when the underfill resin 600 is subjected to the heating processing, stress is concentrated on an interface between a side surface of the copper post 300 and the underfill resin 600.

As a result, a gap S is likely to be formed between the side surface of the copper post 300 and the underfill resin 600 due to deformation resulting from thermal shrinkage of the underfill resin 600.

The reason is described. Since the side surface of the copper post 300 is not formed with sufficient unevenness and an adhesive force between the side surface of the copper post 300 and the underfill resin 600 is weak, the underfill resin 600 deviates from the copper post 300 by the deformation resulting from the thermal shrinkage.

The underfill resin 600 functions as a buffer material for absorbing the stress that is to be generated at a joining part between the copper post 300 of the wiring substrate 100 and the connection terminal 520 of the semiconductor chip 500.

However, when the gap S is generated between the copper post 300 and the underfill resin 600, the function and insulation performance of the underfill resin 600 as a buffer material are lowered, so that the sufficient reliability is not obtained.

A wiring substrate, a manufacturing method thereof and an electronic device of an exemplary embodiment, which will be described later, can solve the above problems.

Exemplary Embodiment

Figure 12:
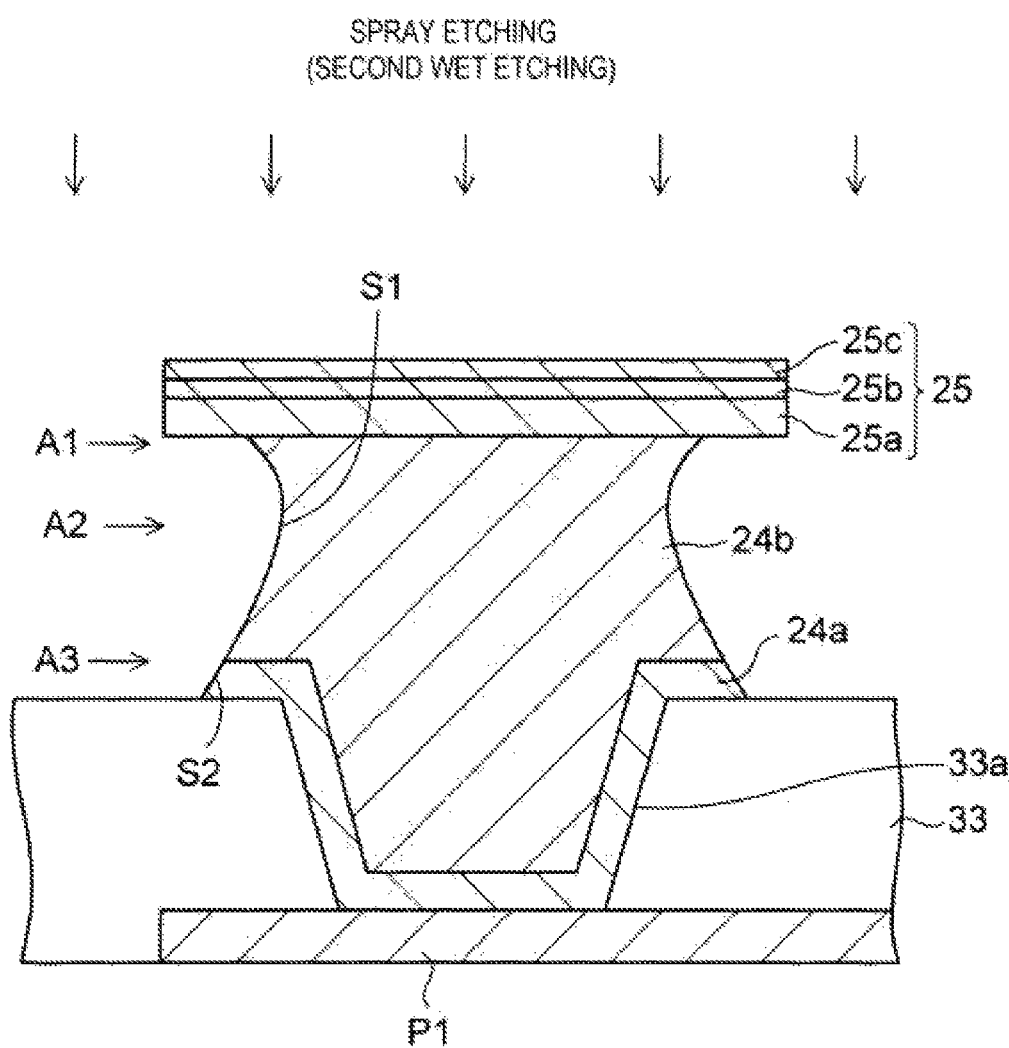
FIG. 12 is a sectional view depicting the manufacturing method of the wiring substrate in accordance with the exemplary embodiment (11 thereof).
Figure 13:
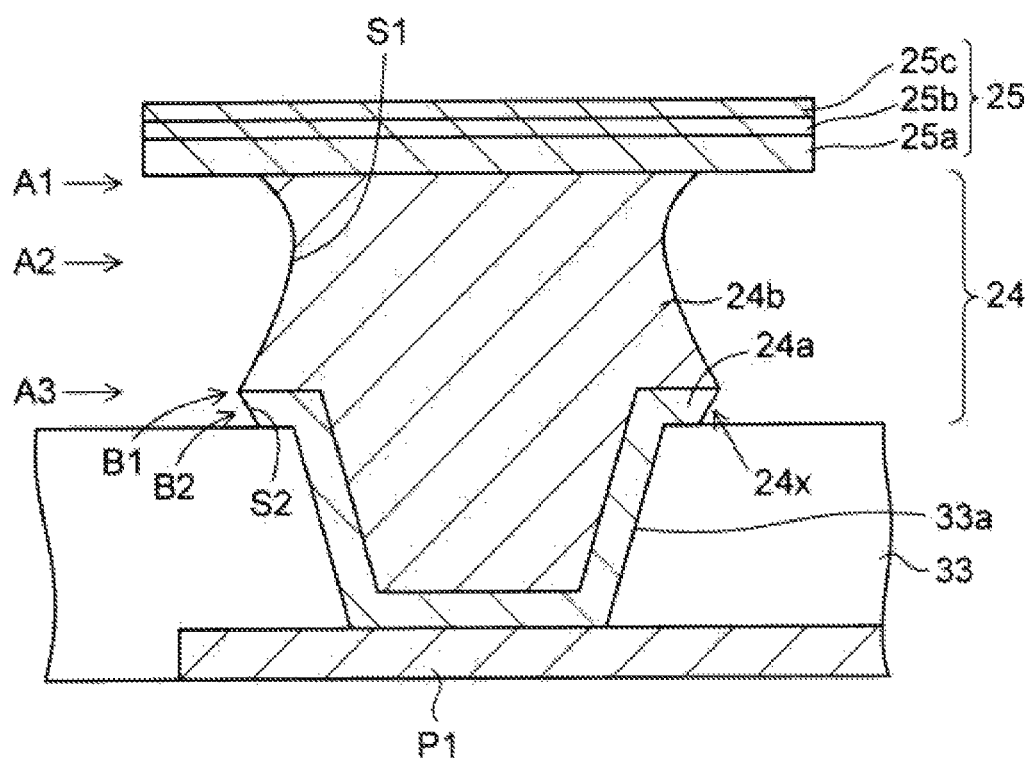
FIG. 13 is a sectional view depicting the manufacturing method of the wiring substrate in accordance with the exemplary embodiment (12 thereof).
Figure 14:
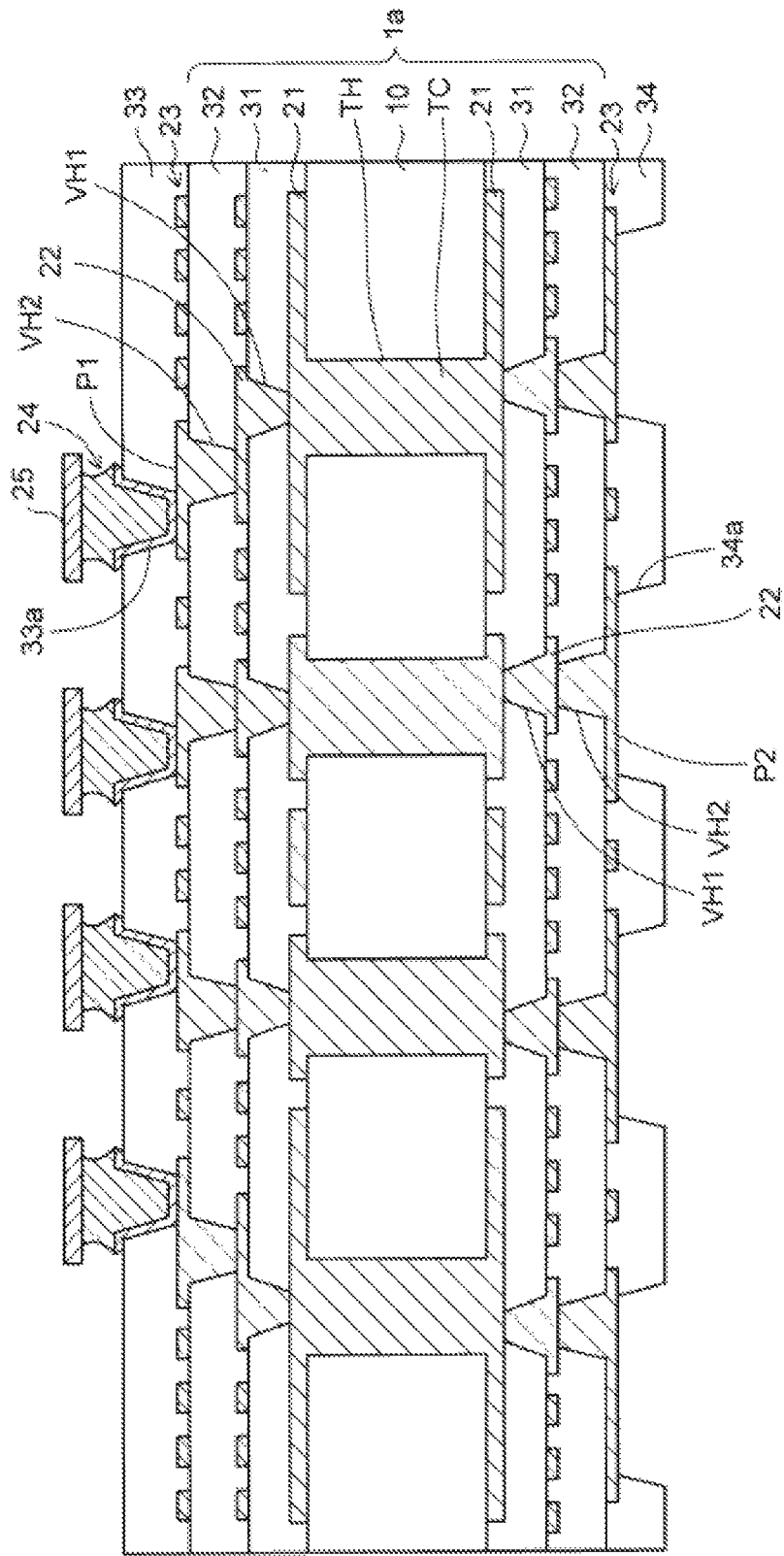
FIG. 14 is a sectional view depicting a wiring substrate in accordance with the exemplary embodiment.
Figure 15A:
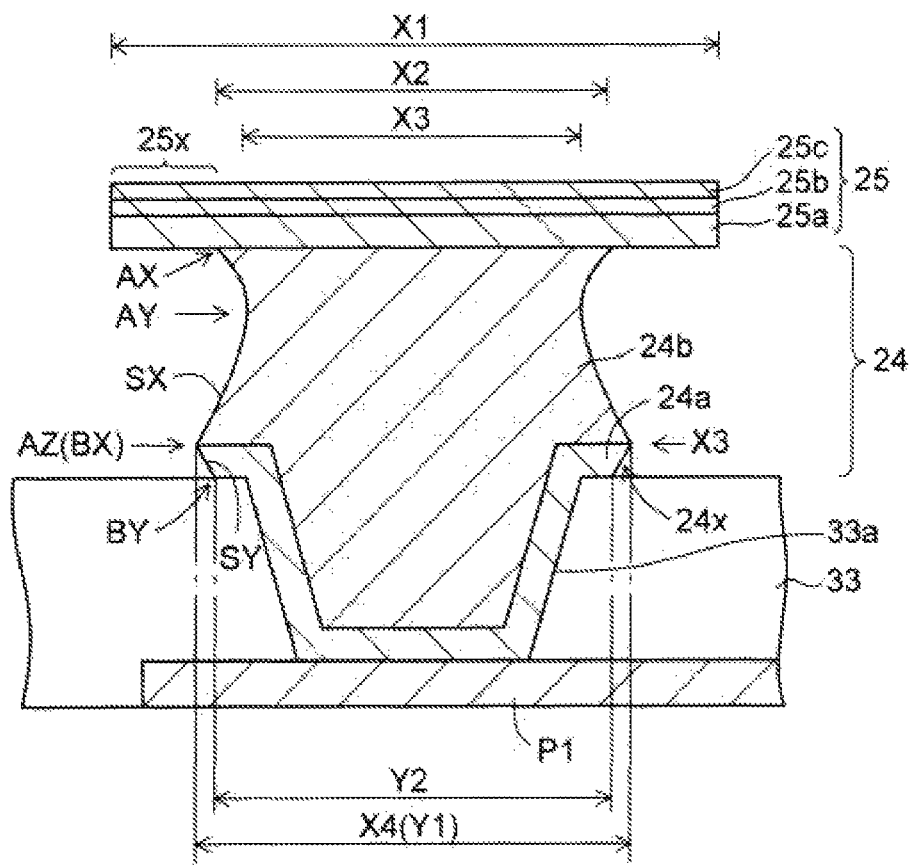
FIG. 15A is a partial sectional view depicting a shape around a metal post and a connection metal layer of the wiring substrate shown in FIG. 14.
Figure 15B:
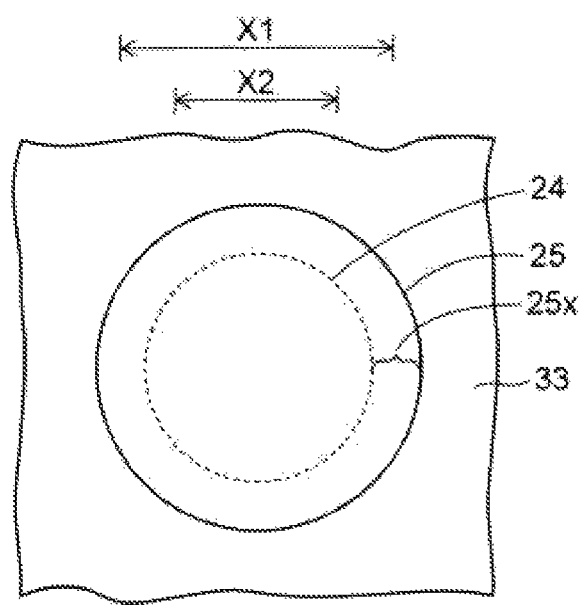
FIG. 15B is a partial plan view depicting a shape around a metal post and a connection metal layer of the wiring substrate shown in FIG. 14.
Figure 16:
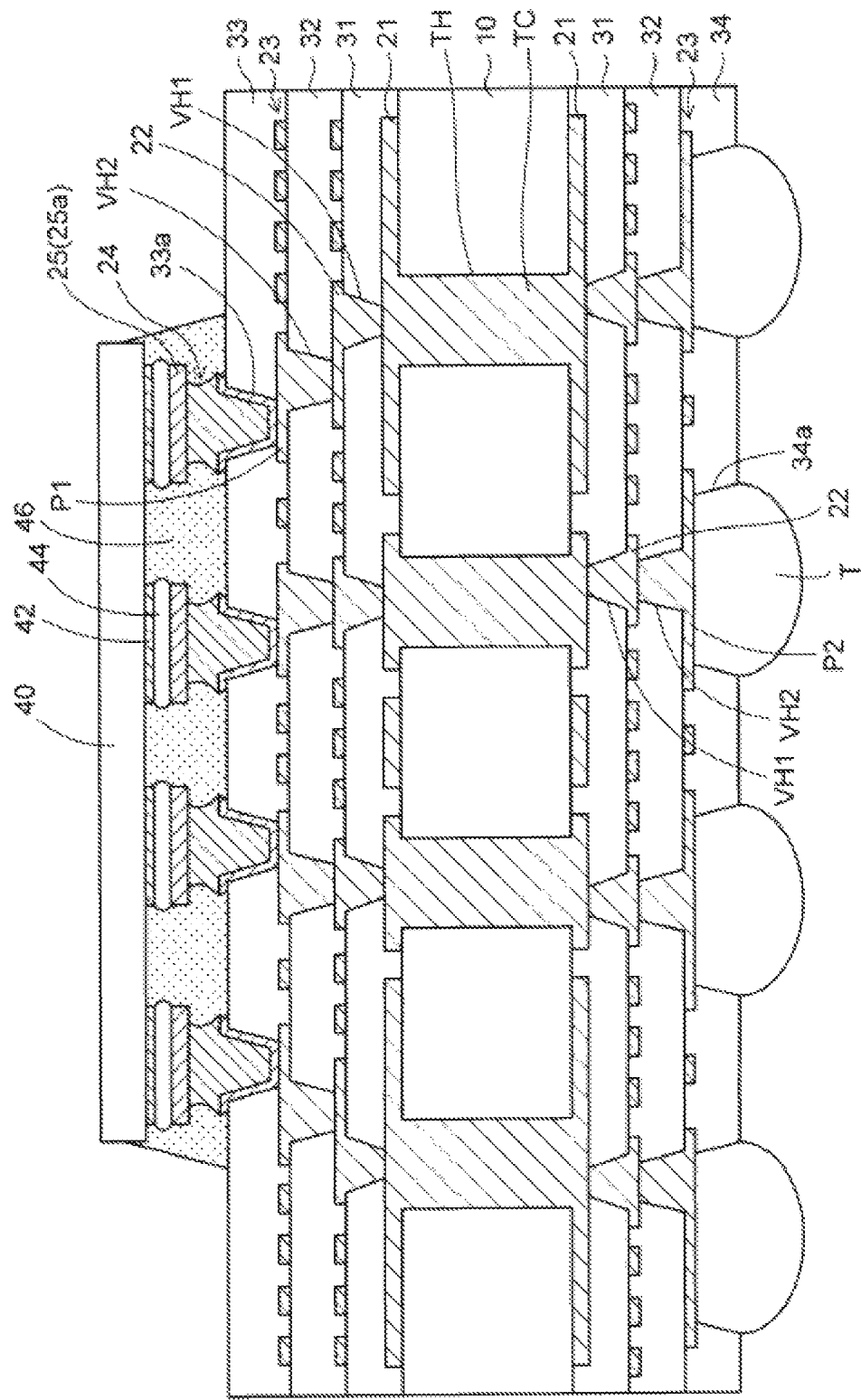
FIG. 16 is a sectional view depicting an electronic component device in accordance with the exemplary embodiment.
Figure 17:
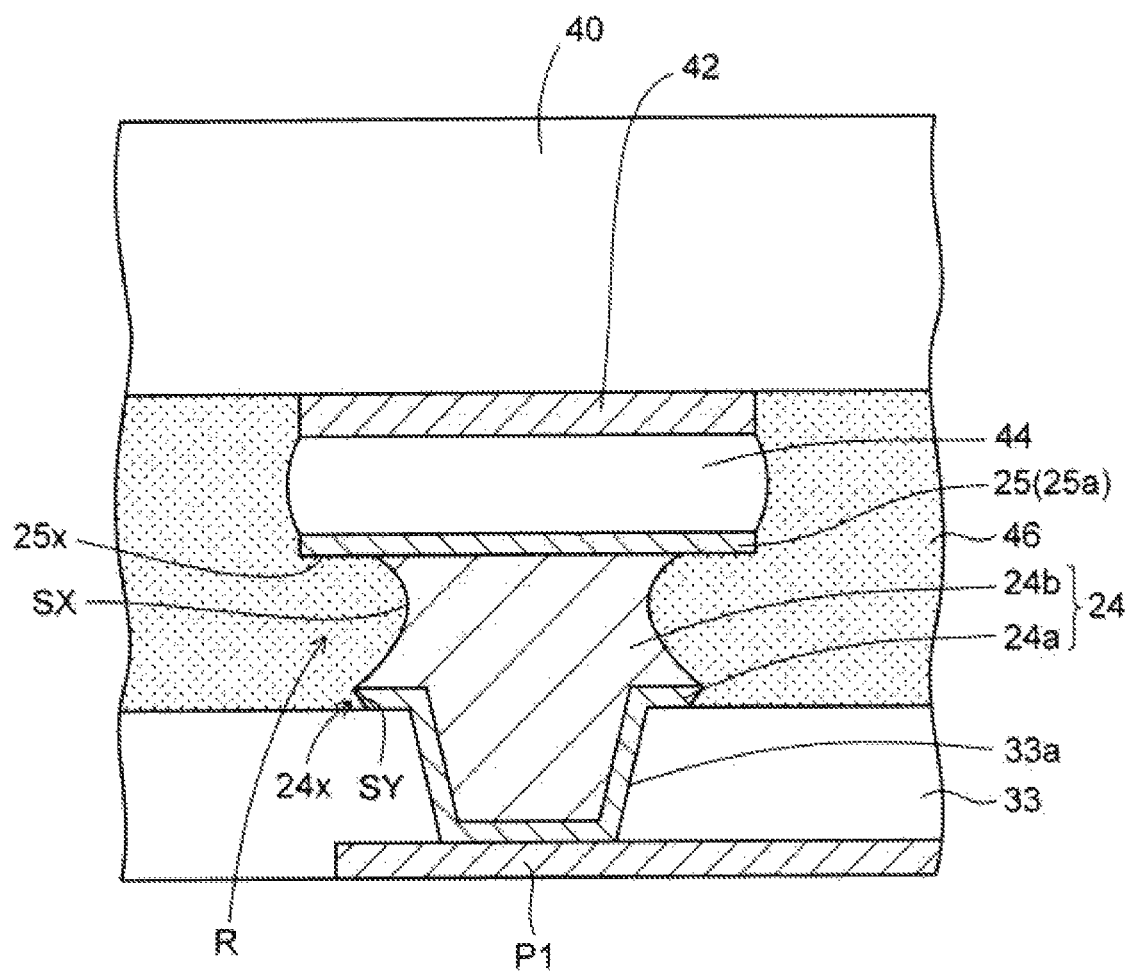
FIG. 17 is a partial sectional view depicting a shape of a connection part between the wiring substrate and a semiconductor chip of the electronic component device shown in FIG. 16.

FIGS. 2 to 13 illustrate a manufacturing method of a wiring substrate in accordance with an exemplary embodiment, FIGS. 14, 15A and 15B illustrate a wiring substrate of the exemplary embodiment, and FIGS. 16 and 17 illustrate an electronic component device of the exemplary embodiment.

In the below, while describing the manufacturing method of the wiring substrate, structures of the wiring substrate and the electronic component device are described.

Figure 2:
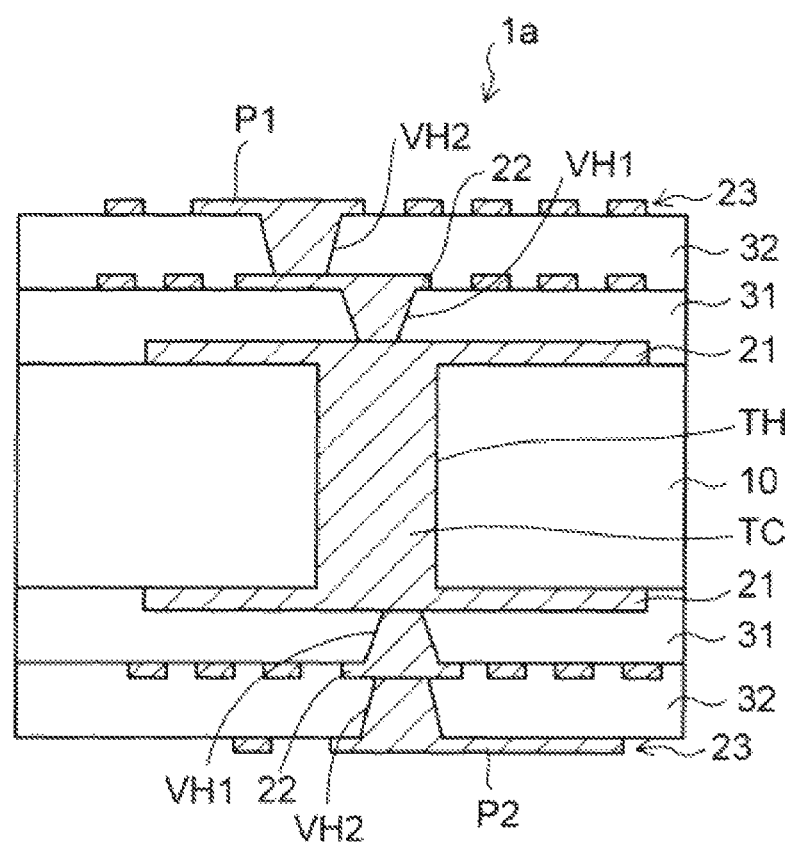
FIG. 2 is a sectional view depicting a manufacturing method of a wiring substrate in accordance with an exemplary embodiment (1 thereof).

In the manufacturing method of the wiring substrate of the exemplary embodiment, as shown in FIG. 2, a wiring member 1a is first prepared. The wiring member 1a includes a core substrate 10 at a center in a thickness direction. The core substrate 10 is formed of an insulation material such as a glass epoxy resin or the like.

Both surfaces of the core substrate 10 are formed with wiring layers 21, respectively. The core substrate 10 is formed with a through-hole TH penetrating therethrough in a thickness direction, and a through-conductor TC is filled in the through-hole TH. The wiring layer 21 and the through-conductor TC are formed of copper, for example.

The wiring layers 21 on both the surfaces of the core substrate 10 are interconnected via the through-conductor TC. The through-hole TH is formed by drilling processing, laser processing or the like, and the wiring layer 21 and the through-conductor TC are formed using a photolithography, a plating technology and the like.

Also, both the surfaces of the core substrate 10 are formed with insulation layers 31 for covering the wiring layers 21, respectively. The insulation layer 31 is formed by bonding an uncured resin sheet such as an epoxy resin, a polyimide resin or the like and curing the resin sheet through heating processing.

Also, the insulation layers 31 of both the surfaces are formed with via holes VH1 reaching the wiring layers 21, respectively. The via hole VH1 is formed by subjecting the insulation layer 31 to laser processing.

Alternatively, the via hole VH1 may be formed by forming the insulation layer 31 with a photosensitive resin and performing exposure and developing on the basis of the photolithography. The insulation layer 31 may also be formed by applying a liquid resin.

Also, the insulation layers 31 of both the surfaces are formed thereon with wiring layers 22, respectively. The wiring layers of both the surfaces are respectively connected to the wiring layers 21 through via conductors in the via holes VH1.

The wiring layer 22 may be formed using a variety of wiring forming methods such as a semi-additive method. When using the semi-additive method, a seed layer is first formed on an inner surface of the via hole VH1 and on the insulation layer 31. The seed layer is formed by an electroless copper plating, for example. Also, the seed layer is formed thereon with a plated resist layer having an opening corresponding to the wiring layer 22.

Continuously, an electrolytic plating is performed by using the seed layer as a plating power feed path, so that a metal plated layer is formed from an inside of the via hole VH1 to an inside of the opening of the plated resist layer. The metal plated layer is formed of copper, for example.

Also, after peeling off the plated resist layer, the seed layer is etched by using the metal plated layer as a mask. Thereby, the wiring layer 22 is formed from the seed layer and the metal plated layer.

Also, the insulation layers 31 of both the surfaces are formed thereon with insulation layers 32 for covering the wiring layers 22. The insulation layers 32 of both the surfaces are formed with via holes VH2 reaching the wiring layers 22, respectively.

The insulation layers 32 of both the surfaces are formed thereon with wiring layers 23, respectively. The wiring layers 23 are connected to the wiring layers 22 through via conductors in the via holes VH2.

The wiring layer 23 of the upper surface-side is formed thereon with pads P1 to which an electronic component is to be connected. The pads P1 may be arranged in an island shape or may be arranged with being coupled to one end or on the way of a lead wiring.

Also, the wiring layer 23 of the lower surface-side is formed thereon with pads P2 to which external connection terminals are to be connected.

In the example of the wiring member 1a shown in FIG. 2, the three layers of the wiring layers 21, 22, 23 are stacked on both the surfaces of the core substrate 10. However, the number of the wiring layers to be stacked may be arbitrarily set.

In this way, the wiring member having the pads is prepared. In FIG. 2, the rigid type wiring member 1a having the core substrate 10 is exemplified. However, a variety of wiring members such as a flexible type wiring member having no core substrate may also be used.

Figure 3:
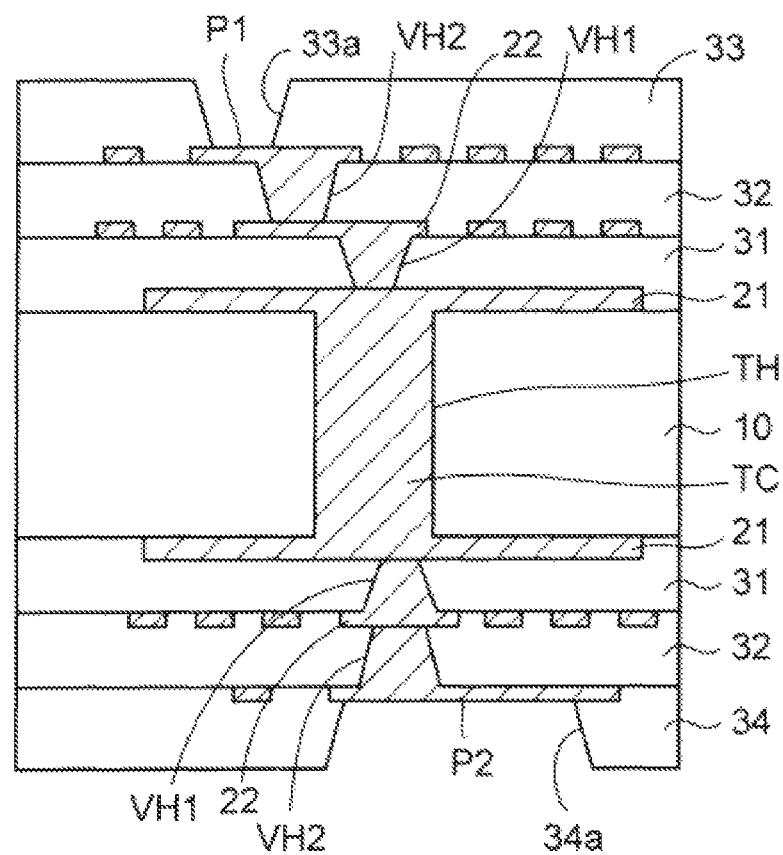
FIG. 3 is a sectional view depicting the manufacturing method of the wiring substrate in accordance with the exemplary embodiment (2 thereof).

Subsequently, as shown in FIG. 3, the insulation layer 32 of the upper surface-side of the wiring member 1a shown in FIG. 2 is formed thereon with a solder resist layer 33 having an opening 33a arranged on the pad P1.

The solder resist layer 33 may be formed by patterning a photosensitive resin by the photolithography or may be formed by printing. When using the photosensitive resin, an epoxy resin or an acryl resin is used, for example.

The solder resist layer 33 having the opening 33a arranged on the pad P1 is an example of an insulation layer having a first opening arranged on a pad.

Likewise, the insulation layer 32 of the lower surface-side is formed thereon (below, in FIG. 3) with a solder resist layer 34 having an opening 34a arranged on the pad P2.

Figure 4:
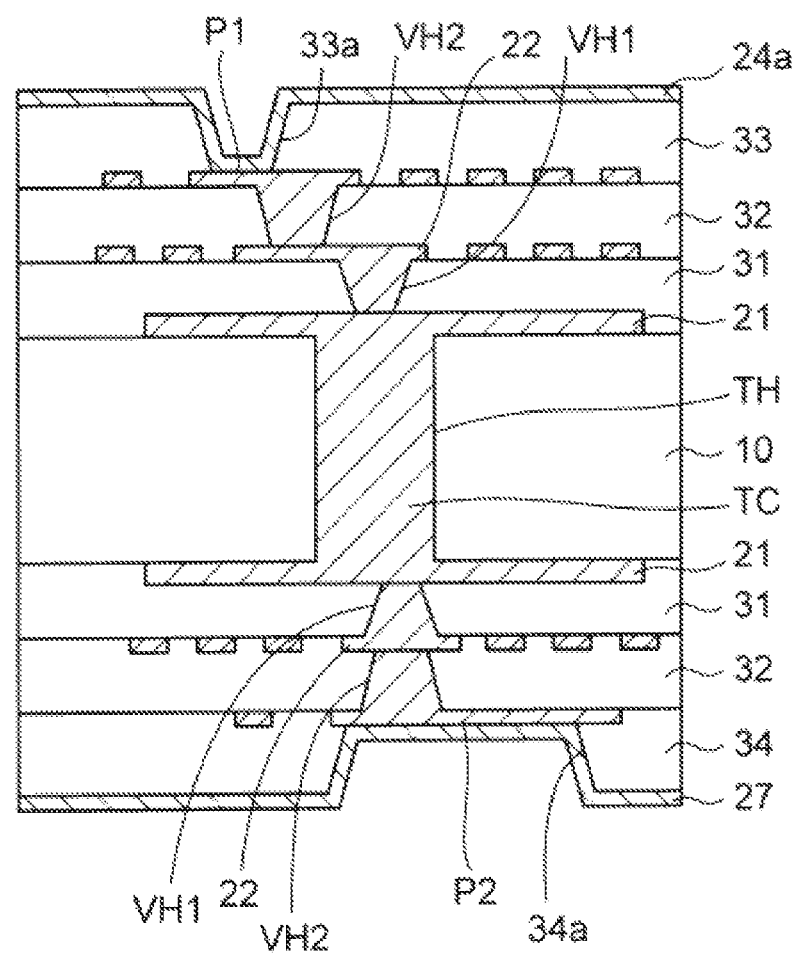
FIG. 4 is a sectional view depicting the manufacturing method of the wiring substrate in accordance with the exemplary embodiment (3 thereof).

Continuously, as shown in FIG. 4, a seed layer 24a is formed from an inner surface of the opening 33a of the solder resist layer 33 of the upper surface-side to an upper surface of the solder resist layer 33 by an electroless plating. For example, the seed layer 24 is formed of copper (Cu) and a thickness thereof is about 1 µm. The seed layer 24a may be formed by a sputtering method, instead of the electroless plating.

Likewise, a seed layer 27 is formed from an inner surface of the opening 34a of the solder resist layer 34 of the lower surface-side to a lower surface of the solder resist layer 34.

In the manufacturing process of forming the multi-layered wiring layers on both the surfaces of the core substrate 10, the same process is preferably performed on both the surfaces of the substrate so as to prevent the substrate from being bent. The seed layer 27 of the lower surface-side is formed so as to prevent the substrate from being bent and will be removed in a later process.

Figure 5:
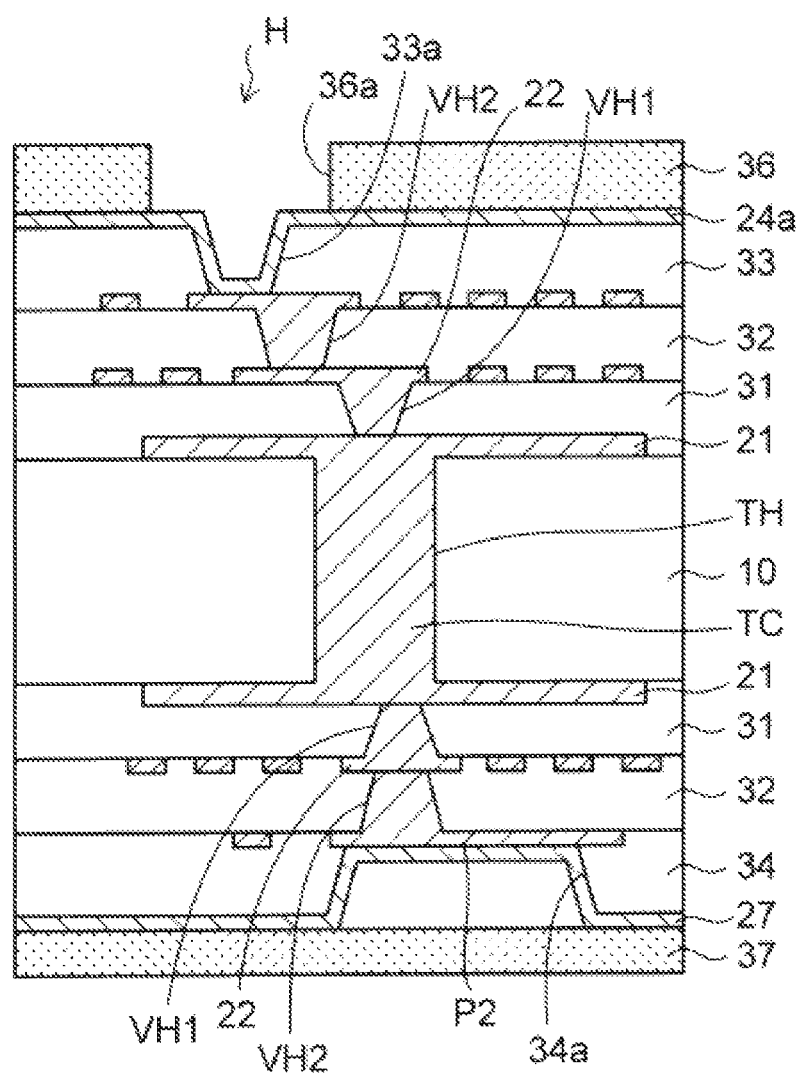
FIG. 5 is a sectional view depicting the manufacturing method of the wiring substrate in accordance with the exemplary embodiment (4 thereof).

Subsequently, as shown in FIG. 5, a plated resist layer 36 having an opening 36a arranged on the opening 33a of the solder resist layer 33 is formed on the seed layer 24a. A diameter of the opening 36a of the plated resist layer 36 is set larger than a diameter of the opening 33a of the solder resist layer 33 by one dimension.

The plated resist layer 36 is an example of a resist layer having a second opening arranged on the first opening.

The opening 36a of the plated resist layer 36 is arranged on the opening 33a of the solder resist layer 33 and communicates with the same, so that a two-step shaped plating hole H, as seen from a sectional view, is established. The seed layer 24a is exposed from a bottom surface in the plating hole H to a part of a height of a sidewall. Also, a plated resist layer 37 is formed on the entire lower surface of the seed layer 27 of the lower surface-side.

Figure 6:
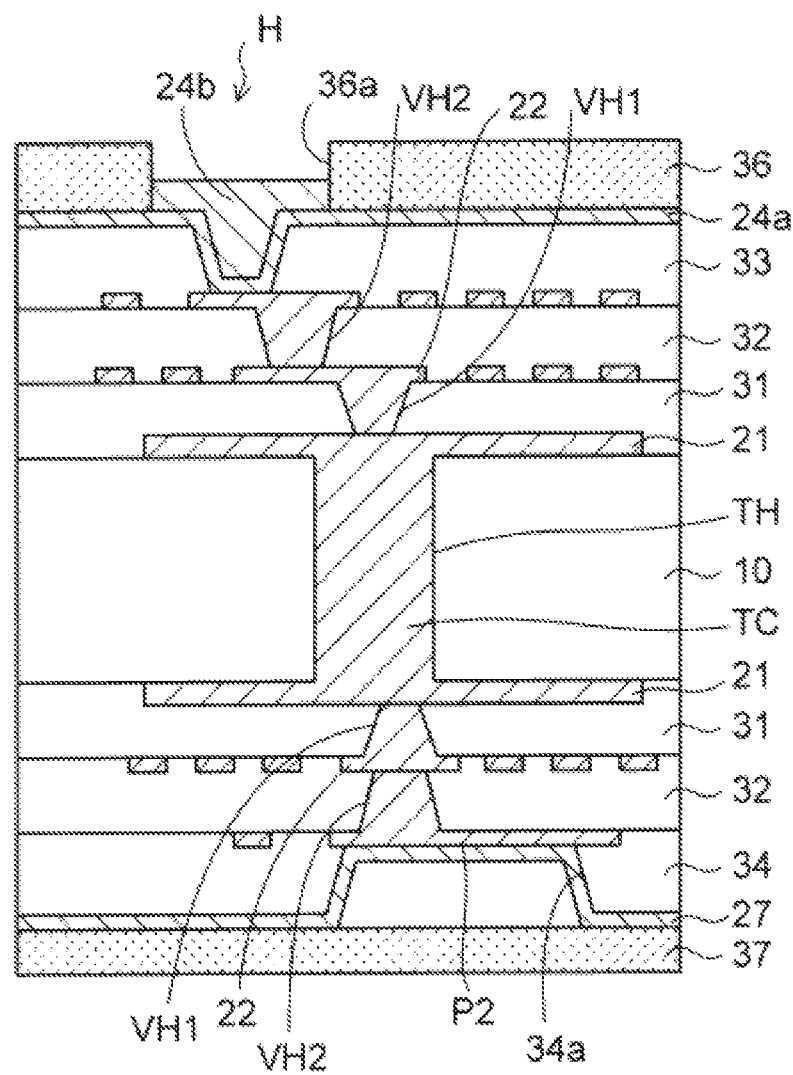
FIG. 6 is a sectional view depicting the manufacturing method of the wiring substrate in accordance with the exemplary embodiment (5 thereof).

Subsequently, as shown in FIG. 6, an electrolytic plating is performed by using the seed layer 24a as a plating power feed path, so that a metal plated layer 24b is formed in the plating hole H.

A plated layer grows from the seed layer 24a formed on the bottom surface and the lower part of the sidewall of the plating hole H, so that a metal plated layer 24b is formed to a partial height so as to fill the plating hole H. The metal plated layer 24b is formed of copper or the like.

At this time, since the seed layer 27 of the lower surface-side of the core substrate 10 is covered with the plated resist layer 37, the plating is not performed for the pad P2 of the lower surface-side.

Figure 7:
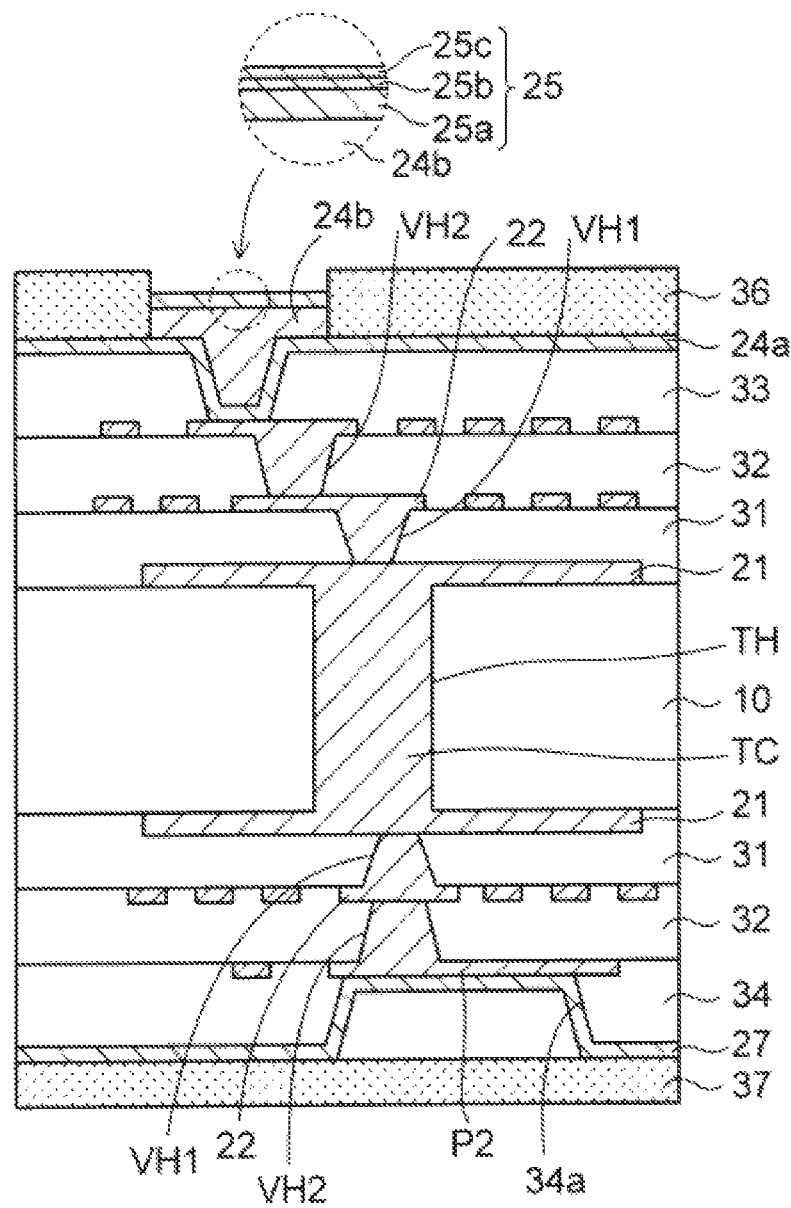
FIG. 7 is a sectional view depicting the manufacturing method of the wiring substrate in accordance with the exemplary embodiment (6 thereof).

Subsequently, as shown in FIG. 7, an electrolytic plating is performed by using the seed layer 24a and the metal plated layer 24b as a plating power feed path, so that a connection metal layer 25 is formed on the metal plated layer 24b.

As shown in a partially enlarged view of FIG. 7, the connection metal layer 25 is formed on the metal plated layer 24b by a nickel (Ni) layer 25a, a palladium (Pd) layer 25b and a gold (Au) layer 25c stacked in corresponding order from below.

By the electrolytic plating, the nickel layer 25a, the palladium layer 25b and the gold layer 25c are formed in corresponding order, so that the connection metal layer 25 is obtained. For example, a thickness of the nickel layer 25a is about 6 µm to 7 µm, a thickness of the palladium layer 25b is about 40 nm, and a thickness of the gold layer 25c is about 60 nm.

As the connection metal layer 25, a metal layer other than the nickel layer 25a, the palladium layer 25b and the gold layer 25c may be used. For example, a film of nickel layer and gold layer stacked in corresponding order from below or a single film of a tin layer may also be used.

Figure 8:
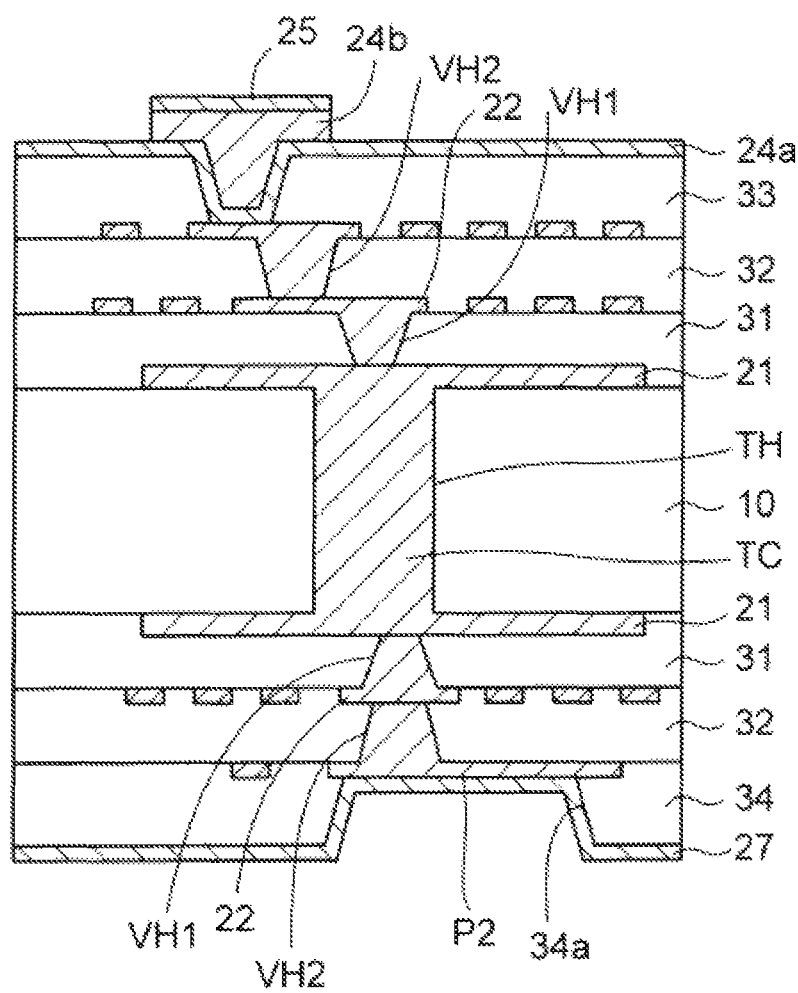
FIG. 8 is a sectional view depicting the manufacturing method of the wiring substrate in accordance with the exemplary embodiment (7 thereof).

Thereafter, as shown in FIG. 8, the plated resist layer 36 of the upper surface-side is removed to expose the seed layer 24a of the upper surface-side. At the same time, the plated resist layer 37 of the lower surface-side is removed to expose the seed layer 27 of the lower surface-side.

Figure 9A:
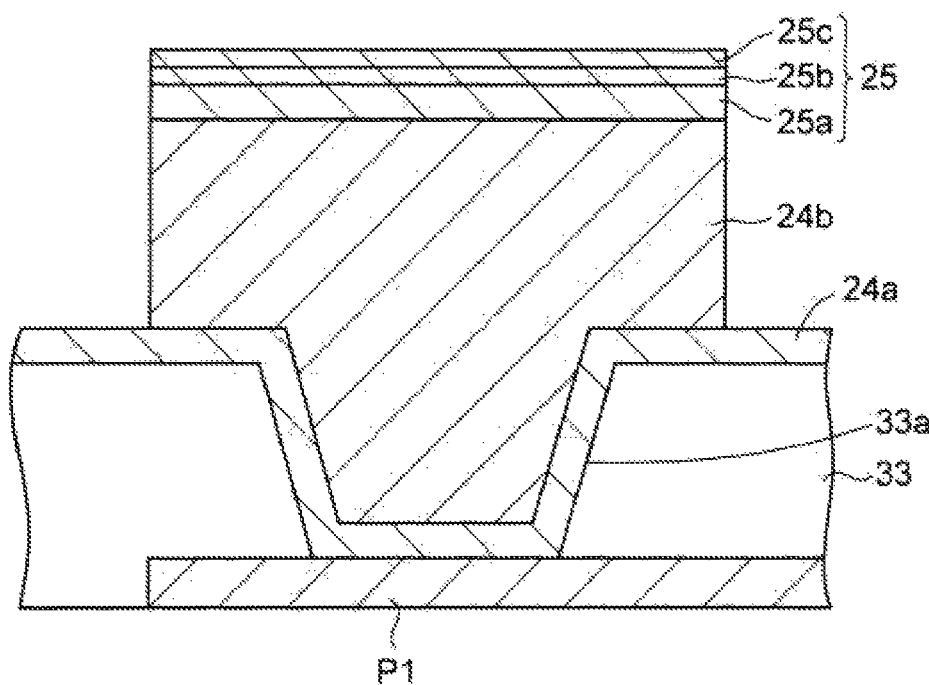
FIG. 9A is a partial sectional view depicting the manufacturing method of the wiring substrate in accordance with the exemplary embodiment (8 thereof).
Figure 9B:
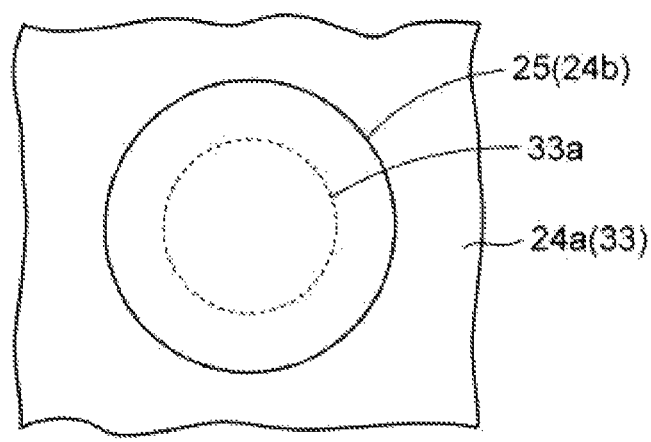
FIG. 9B is a partial plan view depicting the manufacturing method of the wiring substrate in accordance with the exemplary embodiment (8 thereof).

FIG. 9A is a partially enlarged sectional view of a peripheral region including the metal plated layer 24b and the connection metal layer 25 of the structure shown in FIG. 8. FIG. 9B is a partially reduced plan view of FIG. 9A, as seen from above.

As shown in FIG. 9A, the opening 33a of the solder resist layer 33 is arranged on the pad P1. The seed layer 24a is formed from the inner surface of the opening 33a to the upper surface of the solder resist layer 33.

Also, the metal plated layer 24b having a column shape is formed on the seed layer 24a. The metal plated layer 24b is erected from the inside of the opening 33a of the solder resist layer onto the seed layer 24a in a region around the opening. The metal plated layer 24b is formed with filling the opening 33a of the solder resist layer 33, and an upper surface thereof is flat.

Also, the connection metal layer 25 having the nickel layer 25a, the palladium layer 25b and the gold layer 25c stacked in corresponding order from below is formed on the metal plated layer 24b.

In the example of the plan view of FIG. 9B, the metal plated layer 24b and the connection metal layer 25 are formed to have a circular shape, respectively.

The seed layer 24a is etched using the connection metal layer 25 and the metal plated layer 24b of the structure of FIG. 9A as a mask, so that a metal post is obtained below the connection metal layer 25.

In the exemplary embodiment, an etching method is conceived so that, when etching the seed layer 24a, a side surface of the metal plated layer 24b is to be concave and a surface area is to be thus increased.

In the exemplary embodiment, when etching the seed layer 24a, a first wet etching and a second wet etching are performed in two steps. At this time, the seed layer 27 of the lower surface-side shown in FIG. 8 is also etched.

Figure 10:
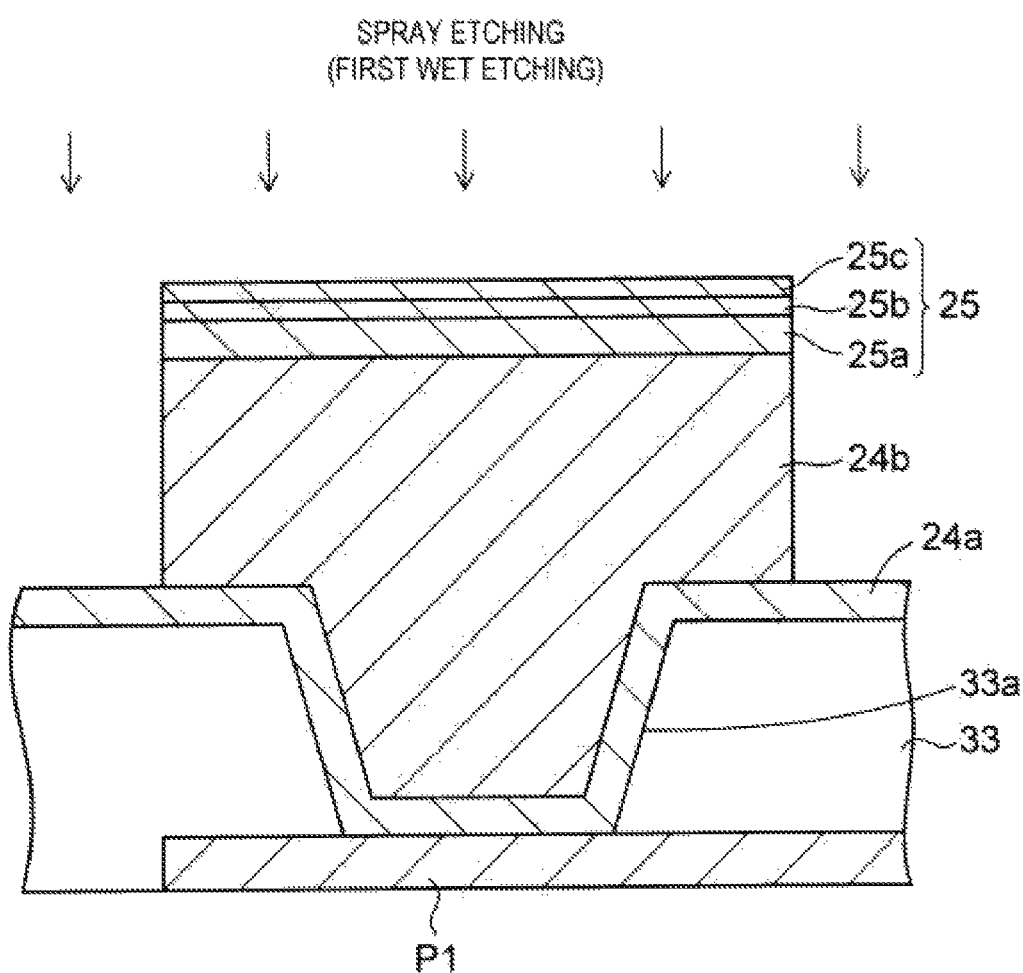
FIG. 10 is a sectional view depicting the manufacturing method of the wiring substrate in accordance with the exemplary embodiment (9 thereof).

First, as shown in FIG. 10, the first wet etching is performed for the structure of FIG. 9A. In the first wet etching, a spray type wet etching apparatus is used.

The spray type wet etching apparatus includes an etching nozzle configured to spray an etching solution to a workpiece.

Also, in the first wet etching, an etching solution with which an isotropic etching of material transfer rate controlling is performed is used. As the etching solution, an aqueous copper chloride solution, an alkali aqueous solution such as an ammonia-based solution, or the like is used.

In the isotropic etching of material transfer rate controlling, an etching amount increases in a region in which a fresh etchant is much supplied.

Also, in the first wet etching, an etching rate of the connection metal layer 25 (Ni layer, Pd layer and Au layer) is slow, so that the metal plated layer 24b (Cu layer) and the seed layer 24a (Cu layer) can be etched using the connection metal layer 25 as a mask.

Also, in the first wet etching, the etching rate is substantially the same between the metal plated layer 24b (electrolytic Cu plated layer) and the seed layer 24a (electroless Cu plated layer).

Figure 11:
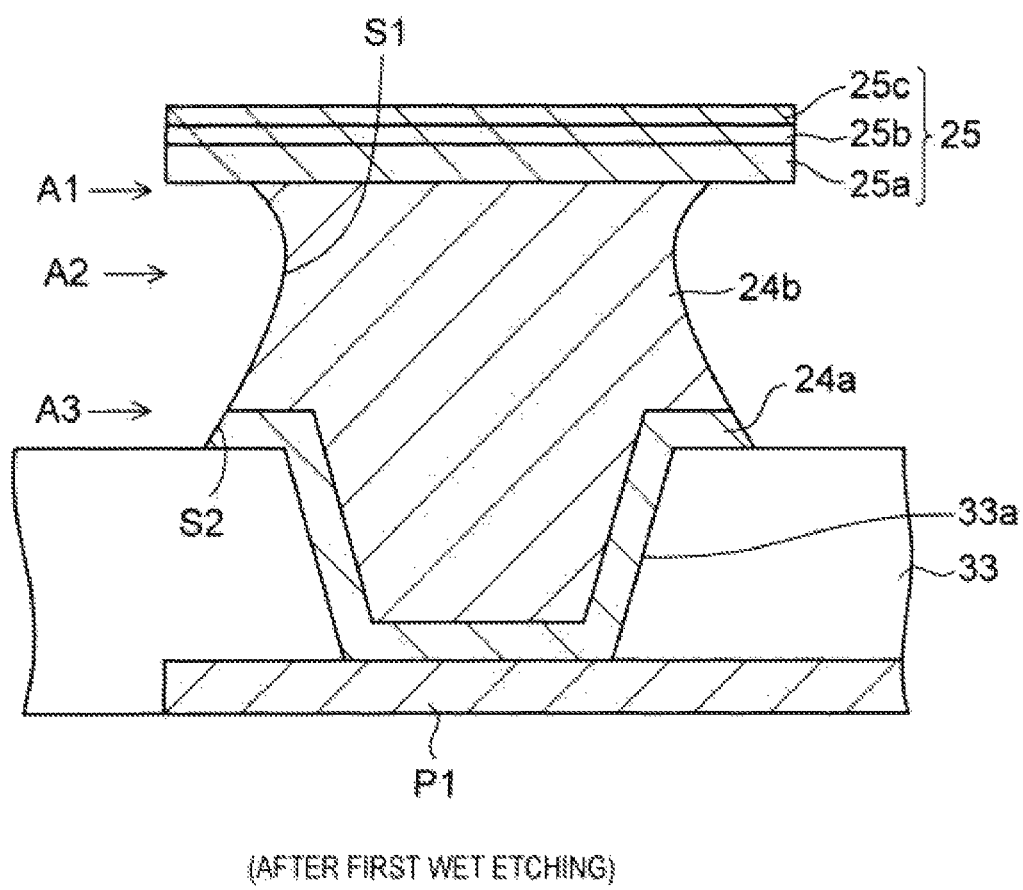
FIG. 11 is a sectional view depicting the manufacturing method of the wiring substrate in accordance with the exemplary embodiment (10 thereof).

FIG. 11 depicts a shape after the metal plated layer 24b and the seed layer 24a are etched using the connection metal layer 25 as a mask by the first wet etching.

In the spray type wet etching apparatus, the etching solution is sprayed from the etching nozzle toward an upper surface and a lower surface of the workpiece and is thus supplied to the workpiece.

For this reason, as shown in FIG. 11, the etching solution is difficult to be supplied to an upper part A1 of an etched side surface S1 of the metal plated layer 24b located immediately below a pattern end portion of the connection metal layer 25 because the connection metal layer 25 functions as a mask. For this reason, an etching amount to an inner side of the metal plated layer 24b is small at the upper part A1 of the etched side surface S1 of the metal plated layer 24b.

In contrast, at an intermediate part A2 of the etched side surface S1 of the metal plated layer 24b spaced downward from the pattern end portion of the connection metal layer 25, the etching solution is well circulated and the fresh etching solution is supplied. Accordingly, the etching amount to the inner side of the metal plated layer 24b increases.

Also, a supply amount of the fresh etching solution decreases at a lower part A3 of the etched side surface S1 of the metal plated layer 24b, as compared to the intermediate part A2. Accordingly, the etching amount to the inner side of the metal plated layer 24b is smaller than at the intermediate part A2.

Also, as described above, in the first wet etching, the etching rate of the seed layer 24a (electroless Cu plated layer) is substantially the same as the etching rate of the metal plated layer 24b (electrolytic Cu plated layer).

For this reason, the seed layer 24a is etched so that an etched side surface S2 is to form the same curved surface as the etched side surface S1 of the metal plated layer 24b.

In this way, the intermediate part A2 of the etched side surface S1 of the metal plated layer 24b is arranged at a more inwardly position than positions of the upper part A1 and the lower part A3.

The first wet etching is performed for the lower surface-side of the substrate, too, so that the seed layer 27 of the lower surface-side shown in FIG. 8 is removed at the same time.

Then, as shown in FIG. 12, the second wet etching is performed for the structure of FIG. 11. The second wet etching is performed so as to arrange the side surface of the seed layer 24a with being recessed inward from the lower part A3 of the etched side surface S1 of the metal plated layer 24b.

Also in the second wet etching, the spray type wet etching apparatus is used. In the second wet etching, a mixed solution of sulfuric acid ($H_2SO_4$) and hydrogen peroxide solution ($H_2O_2$) as the etching solution.

When the mixed solution of sulfuric acid and hydrogen peroxide solution is used as the etching solution, the etching rate of the seed layer 24a (electroless Cu plated layer) becomes about two times of the etching rate of the metal plated layer 24b (electrolytic Cu plated layer).

For example, the etching rate of the seed layer 24a (electroless Cu plated layer) is about 1 μm/min, and the etching rate of the metal plated layer 24b (electrolytic Cu plated layer) is 0.5 μm/min.

FIG. 13 depicts a shape after the structure of FIG. 12 is etched by the second wet etching.

As shown in FIG. 13, when the second wet etching is performed for the structure of FIG. 12, an etched side surface S2 of the seed layer 24a is arranged with being recessed inward from the lower part A3 of the etched side surface S1 of the metal plated layer 24b.

The reason is that the etching rate of the seed layer 24a (electroless Cu plated layer) is higher than the etching rate of the metal plated layer 24b (electrolytic Cu plated layer), as described above.

Also, the etching solution is less supplied to an upper part B1 of the etched side surface S2 of the seed layer 24a located immediately below the metal plated layer 24b because the metal plated layer 24b functions as a mask, so that an etching amount to an inner side of the seed layer 24a is small.

In contrast, since a lower part B2 of the etched side surface S2 of the seed layer 24a is spaced from the metal plated layer 24b and the etching solution is sufficiently supplied thereto in a lateral direction, the etching amount increases.

Thereby, the etched side surface S2 of the seed layer 24a has an inverted taper shape where the lower part B2 is arranged at a more inwardly position than a position of the upper part B1. In this way, the etched side surface S2 of the seed layer 24a is formed with an eroded part 24x recessed inward from the lower end of the metal plated layer 24b.

In the example of FIG. 13, the lower part A3 of the etched side surface S1 and the upper part B1 of the etched side surface S2 are coupled in an acute angle shape but may also be coupled in a curved surface shape.

By the above processes, the seed layer 24a is patterned, so that the metal post 24 is formed by the seed layer 24a and the metal plated layer 24b. Thereby, a structure where the connection metal layer 25 is arranged on the metal post 24 is obtained.

In the meantime, if the seed layer 27 of the lower surface-side is not completely removed by the first wet etching, the second wet etching may be performed for the lower surface-side of the substrate, too, thereby completely removing the seed layer 27 of the lower surface-side.

By the first and second wet etchings, the pad P2 of the lower surface-side is a little etched. However, this is not problematic because an etching amount thereof is very small.

FIG. 14 depicts an entire shape of one product region of a wiring substrate 1. When a large-size multi-surface substrate having a plurality of product regions demarcated thereon is used as the core substrate 10, the large-size substrate is cut before or after mounting semiconductor chips, so that the wiring substrate 1 is obtained from each product region.

By the above processes, as shown in FIG. 14, the wiring substrate 1 of the exemplary embodiment is manufactured.

As shown in FIG. 14, the wiring substrate 1 of the exemplary embodiment includes the wiring member 1a having the structure shown in FIG. 2.

The solder resist layer 33 having the openings 33a arranged on the pads P1 is formed on the insulation layer 32 of the upper surface-side of the wiring member 1a. The solder resist layer 33 is an example of an insulation layer having an opening on a pad. Also, the metal post 24 and the connection metal layer 25 are formed in corresponding order on the pad P1.

Also, the solder resist layer 34 having the openings 34a arranged on the pads P2 is formed on the insulation layer 32 of the lower surface-side of the core substrate 10.

FIG. 15A is a partially enlarged sectional view of a peripheral region including the metal post 24 and the connection metal layer 25 shown in FIG. 14, and FIG. 15B is a partially reduced plan view of FIG. 15A, as seen from above.

As shown in FIG. 15A, the metal post 24 is formed from the opening 33a of the solder resist layer 33 to the upper surface of the solder resist layer 33 around the opening.

The metal post 24 is formed by the seed layer 24a and the metal plated layer 24b arranged thereon. The seed layer 24a extends from the upper surface of the pad P1 to the upper surface of the solder resist layer 33 around the opening 33a along the sidewall of the opening 33a of the solder resist layer 33.

The metal post 24 is erected from the upper surface of the solder resist layer 33 with being embedded in the opening 33a of the solder resist layer 33. Also, the connection metal layer 25 is formed on the metal post 24.

In this way, the metal post 24 and the connection metal layer 25 are connected to the pad P1 of the upper surface-side of the wiring substrate 1. A side surface SY of the seed layer 24a of the metal post 24 and a side surface SX of the metal plated layer 24b are exposed from the solder resist layer 33.

The pad P1 of the upper surface-side of the wiring substrate 1 is a pad for mounting an electronic component, and an electronic component is connected to the connection metal layer 25 on the metal post 24.

As shown in FIG. 15A, the metal plated layer 24b of the metal post 24 arranged below the connection metal layer 25 is arranged with being recessed inward from the pattern end portion of the connection metal layer 25.

Referring to the partially reduced plan view of FIG. 15B, the metal post 24 and the connection metal layer 25 are formed to have a circular shape, respectively, and a diameter X2 of an upper end AX of the metal plated layer 24b of the metal post 24 is set smaller than a diameter X1 of the connection metal layer 25.

Thereby, a peripheral edge part of the connection metal layer 25 becomes a protrusion 25x protruding outward from the upper end AX of the metal post 24. The protrusion 25x is arranged with being coupled to a periphery of the metal post 24 in a doughnut shape, as shown in FIG. 15B.

Also, the side surface SX of the metal plated layer 24b of the metal post 24 is formed as a concave surface recessed inward from the lower end of the connection metal layer 25. The diameter X2 of the upper end AX of the metal plated layer 24b is set greater than a diameter X3 of an intermediate part AY of the metal plated layer 24b.

A diameter X4 of a lower end AZ of the metal plated layer 24b is set greater than the diameter X2 of the upper end AX and the diameter X3 of the intermediate part AY.

Also, a lower end BY of the seed layer 24a of the metal post 24 is arranged at a more inwardly position than a position of an upper end BX of the seed layer 24a. Therefore, a diameter Y2 of the lower end BY of the seed layer 24a of the metal post 24 is set smaller than a diameter Y1 of the upper end BX of the seed layer 24a.

In the example of FIG. 15A, the side surface SX and the side surface SY are coupled in an acute angle shape but may be coupled in a curved surface shape.

In this way, the side surface SY of the seed layer 24a of the metal post 24 is formed to have an inverted taper shape of which the diameter decreases from the upper end BX toward the lower end BY, and the side surface SY is formed with the eroded part 24x recessed inward from the lower end of the metal plated layer 24b. The eroded part 24x of the seed layer 24a is arranged with being coupled in a circle shape below an outer periphery of the metal plated layer 24b.

Like this, the side surface SX of the metal plated layer 24b of the metal post 24 is formed as the concave surface, and the side surface SY of the seed layer 24a is formed with the eroded part 24x. The side surface SX of the metal post 24 is concave in a curved surface shape in an axial direction of the post.

For this reason, a surface area of the side surface of the metal post 24 is larger, as compared to a configuration where the side surface has a straight shape. Therefore, since a contact area with an underfill resin (which will be described later) increases, it is possible to increase the adhesive force between the underfill resin and the metal post 24.

Also, the protrusion 25x of the connection metal layer 25 and the eroded part 24x of the seed layer 24a of the metal post 24 function as a wedge for fixing the underfill resin. For this reason, the underfill resin is prevented from deviating upward from the metal post 24 due to deformation resulting from thermal shrinkage during heating processing.

Subsequently, a method of establishing an electronic component device by using the wiring substrate 1 of the exemplary embodiment shown in FIG. 15A is described.

As shown in FIG. 16, a semiconductor chip 40 having connection terminals 42 provided on a lower surface is prepared. The semiconductor chip 40 is an example of the electronic component.

The connection terminals 42 of the semiconductor chip 40 are flip chip-connected to the connection metal layers 25 on the metal posts 24 of the wiring substrate 1 shown in FIG. 14 by solders 44.

When reflow heating the solder 44, the gold layer 25c and the palladium layer 25b of the connection metal layer 25 are caused to flow out to the solder 44 and are thus lost but the nickel layer 25a is left. Thereby, the metal post 24 is connected to the connection terminal 42 of the semiconductor chip 40 via the connection metal layer 25 composed of the nickel layer 25a and the solder 44.

Also, an underfill resin 46 is filled in a gap between the semiconductor chip 40 and the wiring substrate 1.

As the underfill resin 46, a thermoset epoxy resin including a filler such as silica, or the like is used. Also, a solder ball is mounted to the pad P2 of the lower surface-side of the wiring substrate 1, so that an external connection terminal T is formed.

By the above processes, an electronic component device 2 of the exemplary embodiment is manufactured.

Although not particularly shown, the external connection terminal T of the electronic component device 2 of the exemplary embodiment is connected to a connection electrode of a mounting substrate such as a motherboard by reflow heating the solder. When a lead-free solder such as a tin (Sn), silver (Ag) and copper (Cu) solder is used, the reflow heating is performed at temperatures of 230° C. to 260° C.

FIG. 17 is a partially enlarged sectional view depicting a connection part between the wiring substrate 1 and the semiconductor chip 40 of the electronic component device 2 shown in FIG. 16.

Referring to FIG. 17, linear thermal expansion coefficients are different between the metal post 24 of the wiring substrate 1 and the underfill resin 46.

For this reason, when the underfill resin 46 is heated by the reflow heating upon connection of the electronic component device 2 to the mounting substrate, stress is concentrated on an interface between the side surface SX of the metal post 24 and the underfill resin 46. Thereby, the underfill resin 46 is likely to be deformed due to the thermal shrinkage.

However, in the exemplary embodiment, as described above, the side surface SX of the metal plated layer 24b of the metal post 24 is formed as a concave curved surface. For this reason, since a contact area between the side surface of the metal post 24 and the underfill resin 46 increases, it is possible to increase the adhesive force between the metal post 24 and the underfill resin 46.

Thereby, a gap is prevented from being generated, which is caused when the underfill resin 46 deviates laterally from the side surface of the metal post 24 due to the deformation resulting from the thermal shrinkage of the underfill resin 46 upon the reflow heating.

Also, the peripheral edge part of the connection metal layer 25 on the metal post 24 becomes the protrusion 25x protruding outward. Also, the side surface SY of the seed layer 24a of the metal post 24 is formed with the eroded part 24x.

In a vertical direction of a region denoted with R in FIG. 17, the protrusion 25x of the connection metal layer 25 and the eroded part 24x of the seed layer 24a function as a wedge for preventing the underfill resin 46 from deviating upward.

Thereby, the underfill resin 46 is prevented from deviating upward from the side surface of the metal post 24, which is caused due to the deformation resulting from the thermal shrinkage of the underfill resin 46 during the reflow heating. Also, the underfill resin 46 is prevented from being peeled off from the solder resist layer 33.

Since a gap is not generated between the metal post 24 and the underfill resin 46, the function and insulation performance of the underfill resin 46 as a buffer material are secured, so that the sufficient reliability is obtained.

As described above, even when the electronic component device is heated due to the heat that is to be generated during a variety of heating processing such as the reflow heating or when a product is actually used, it is possible to secure the sufficient reliability of the connection part between the wiring substrate and the electronic component.

This disclosure further encompasses various exemplary embodiments, for example, described below.

1. A manufacturing method of a wiring substrate, comprising:

preparing a wiring member having a pad;

forming, on the wiring member, an insulation layer having a first opening to be arranged on the pad;

forming a seed layer on an inner surface of the first opening and on an upper surface of the insulation layer;

forming, on the insulation layer, a resist layer having a second opening to be arranged on the first opening;

forming, on the seed layer in the first opening and the second opening, a metal plated layer and a connection metal layer in corresponding order by an electrolytic plating;

removing the resist layer;

etching side surfaces of the metal plated layer and the seed layer by a first wet etching, thereby forming a side surface of the metal plated layer as a concave surface recessed inward from a lower end of the connection metal layer, and forming, on a side surface of the seed layer, an eroded part recessed inward from a lower end of the metal plated layer by a second wet etching.

2. The manufacturing method of a wiring substrate according to claim 1, wherein the first wet etching is performed by a spray type wet etching apparatus in which an aqueous copper chloride solution or an alkali aqueous solution is used, and wherein the second wet etching is performed by a spray type wet etching apparatus in which a mixed solution of sulfuric acid and hydrogen peroxide solution is used.

3. The manufacturing method of a wiring substrate according to claim 1 or 2, wherein in the first wet etching,
a diameter of an upper end of the metal plated layer is set smaller than a diameter of the connection metal layer,
a diameter of the lower end of the metal plated layer is set larger than the diameter of the upper end of the metal plated layer, and
wherein in the second wet etching,
a diameter of a lower end of the seed layer is set smaller than a diameter of an upper end of the seed layer.

4. The manufacturing method of a wiring substrate according to one of claims 1 to 3, wherein in the forming the seed layer,
the seed layer is formed of an electroless copper plated layer, and
wherein in the forming the metal plated layer and the connection metal layer,
the metal plated layer is formed of an electrolytic copper plated layer, and
the connection metal layer is formed by a nickel layer, a palladium layer and a gold layer stacked in corresponding order from below.

What is claimed is:

1. A wiring substrate comprising:
a pad;
an insulation layer having an opening arranged on the pad;
a metal post including a seed layer and a metal plated layer, the seed layer arranged on the pad and an upper surface of the insulation layer, the metal plated layer arranged on the seed layer; and
a connection metal layer formed on the metal plated layer,
wherein a side surface of an upper portion of the metal plated layer above the opening has a concave surface recessed inward from a lower end of the connection metal layer, and
wherein a side surface of the seed layer is recessed inward from a lower end of the upper portion of the metal plated layer.

2. The wiring substrate according to claim 1, wherein a diameter of an upper end of the metal plated layer is smaller than a diameter of the connection metal layer, and
wherein a diameter of the lower end of the metal plated layer is larger than the diameter of the upper end of the metal plated layer and a diameter of a lower end of the seed layer is smaller than a diameter of an upper end of the seed layer.

3. The wiring substrate according to claim 1, wherein the lower end of the metal plated layer and an upper end of the seed layer are arranged at the same height and are also arranged at more inwardly positions than a position of the connection metal layer.

4. The wiring substrate according to claim 1, wherein a portion of the seed layer is formed along an upper surface of the pad and a sidewall of the opening of the insulation layer, and a lower portion of the metal plated layer is embedded in the opening of the insulation layer.

5. The wiring substrate according to claim 1, wherein the connection metal layer includes a nickel layer, a palladium layer and a gold layer stacked in corresponding order from below,
wherein the seed layer is an electroless copper plated layer, and
wherein the metal plated layer is an electrolytic copper plated layer.

6. An electronic component device comprising:
a wiring substrate comprising:
a pad;
an insulation layer having an opening arranged on the pad;
a metal post including a seed layer and a metal plated layer, the seed layer arranged on the pad and an upper surface of the insulation layer, the metal plated layer arranged on the seed layer, and
a connection metal layer formed on the metal plated layer,
a side surface of an upper portion of the metal plated layer above the opening having a concave surface recessed inward from a lower end of the connection metal layer, and
a side surface of the seed layer being recessed inward from a lower end of the upper portion of the metal plated layer;
an electronic component connected to the connection metal layer on the metal post of the wiring substrate; and
an underfill resin filled between the electronic component and the wiring substrate.

7. The electronic component device according to claim 6, wherein a diameter of an upper end of the metal plated layer is smaller than a diameter of the connection metal layer, and
wherein a diameter of the lower end of the metal plated layer is larger than the diameter of the upper end of the metal plated layer and a diameter of a lower end of the seed layer is smaller than a diameter of an upper end of the seed layer.

8. The electronic component device according to claim 6, wherein the lower end of the metal plated layer and an upper end of the seed layer are arranged at the same height and are also arranged at more inwardly positions than a position of the connection metal layer.

9. The electronic component device according to claim 6, wherein a portion of the seed layer is formed along an upper surface of the pad and a sidewall of the opening of the insulation layer, and a lower portion of the metal plated layer is embedded in the opening of the insulation layer.

10. The electronic component device according to claim 6, wherein the connection metal layer includes a nickel layer, a palladium layer and a gold layer stacked in corresponding order from below,
wherein the seed layer is an electroless copper plated layer, and
wherein the metal plated layer is an electrolytic copper plated layer.

11. The electronic component device according to claim 6, wherein a connection terminal of the electronic component is connected to the connection metal layer of the wiring substrate by solder.

* * * * *